United States Patent [19]

Sekine

[11] Patent Number: 4,602,289
[45] Date of Patent: Jul. 22, 1986

[54] SOLID STATE IMAGE PICK-UP DEVICE

[75] Inventor: Hirokazu Sekine, Yokohama, Japan

[73] Assignee: Tokyo Shibaura Denki Kabushiki Kaisha, Tokyo, Japan

[21] Appl. No.: 497,130

[22] Filed: May 23, 1983

[30] Foreign Application Priority Data

May 31, 1982 [JP] Japan .................................. 57-92907
Mar. 22, 1983 [JP] Japan .................................. 58-47497

[51] Int. Cl.$^4$ ........................ H04N 3/14; H01L 29/78
[52] U.S. Cl. ..................................... 358/213; 357/24; 357/30; 250/578; 307/311
[58] Field of Search ............... 357/24 LR, 24 M, 30; 250/211 J, 578; 307/311; 358/213

[56] References Cited

U.S. PATENT DOCUMENTS 4,012,587 3/1977 Ochi et al. ............................. 358/213
4,081,841 3/1978 Ochi et al. ........................ 250/211 J
4,336,556 6/1982 Sekine et al. ...................... 250/211 J

OTHER PUBLICATIONS

Ochi et al., "A Device Structure and Spatial Spectrum for Checker-Pattern CCD Color Camera," IEEE Journal of Solid State Circuits, vol. SC-13, No. 1, Feb. 1978, New York.

Primary Examiner—Gene M. Munson
Attorney, Agent, or Firm—Finnegan, Henderson, Farabow, Garrett & Dunner

[57] ABSTRACT

A solid-state image pick-up device is provided which comprises a first group of photosensitive pixels formed on a semiconductor substrate of one conductivity type and arranged in a first two-dimensional matrix form, each of the pixels of the first group inclined by 45° with respect to a horizontal direction; a second group of photosensitive pixels vertically offset from the first group of photosensitive pixels by a distance corresponding to about half a vertical pixel pitch, horizontally offset from the first group of photosensitive pixels by a distance corresponding to a horizontal dimension of each pixel, and having oblique gaps between obliquely adjacent ones of the pixels arranged in the matrix forms, each pixel of the second group being inclined by 45° with respect to the horizontal direction; and a plurality of vertical registers arranged to extend in the oblique gaps and gaps between vertically adjacent ones of the pixels of each of the columns of the pixels.

3 Claims, 15 Drawing Figures

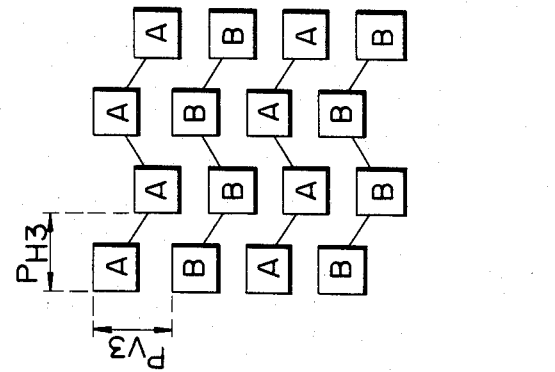
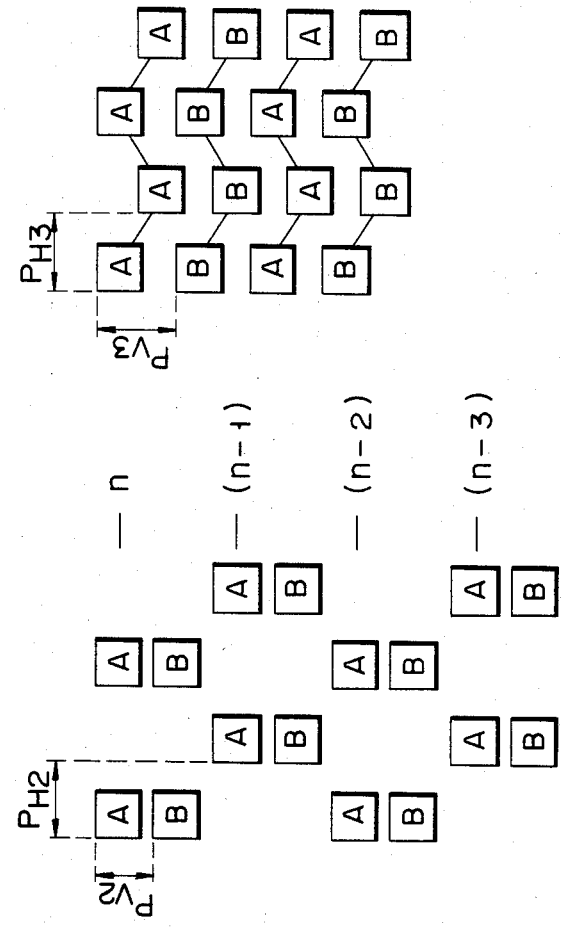
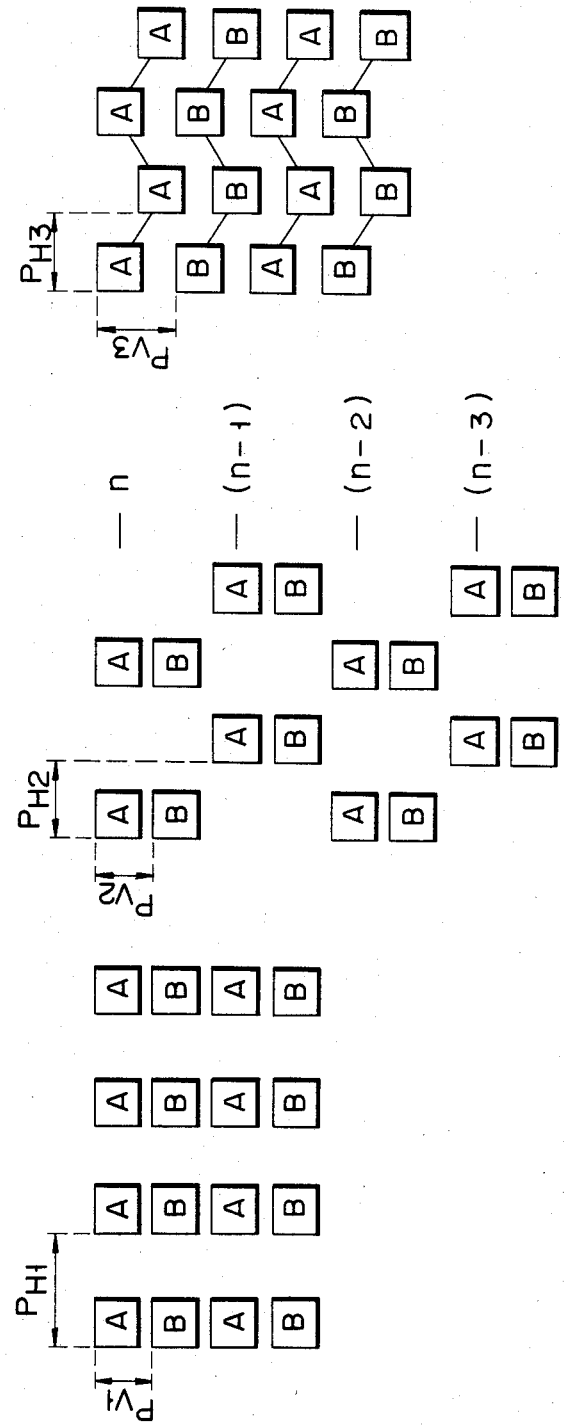

SOLID STATE IMAGE PICK-UP DEVICE

BACKGROUND OF THE INVENTION

The present invention relates to a solid-state image pick-up device and, more particularly, to such a device using CCDs (Charge Coupled Devices).

In a conventional CCD image pick-up device of, for example, the interline transfer type, photosensitive pixels or picture element signals are arranged as shown in FIGS. 1A to 1C. In FIGS. 1A to 1C, vertical and horizontal CCD registers for transferring and reading out the pixels are omitted.

FIG. 1A shows a CCD image pick-up device in which pixels are arranged in a typical matrix form. In order to read out the signal charge with this area sensor using the interlace method, for example, the readout operation of signals from pixels A belonging to the field A and the readout operation of signals from pixels B belonging to the field B are alternately repeated.

FIG. 2 shows a schematic plan view of a conventional CCD image pick-up device having a pixel arrangement as shown in FIG. 1A. In this area sensor, pixels P are arranged in a matrix form on a semiconductor substrate of one conductivity type. A vertical CCD register R is arranged linearly for each vertical pixel column. The vertical CCD registers R of 2-phase drive type are shown in the figure. Transfer electrodes $\phi_1$ and $\phi_2$ of the respective phases comprise transfer portions $\phi_1^T$ and $\phi_2^T$ and storing portions $\phi_1^S$ and $\phi_2^S$, respectively, as shown in FIG. 3.

In the pixel arrangement shown in FIG. 1A, the vertical pixel pitch $P_{V1}$ is substantially determined by the vertical dimension of the pixels. Therefore, pixels may be packed at high density in the vertical direction. However, since the horizontal pixel pitch $P_{H1}$ is determined by the combination of the horizontal dimension of the pixels and the width of the vertical CCD register, the pixels cannot be densely packed in the horizontal direction. Even with the most advanced micronization technique presently available, only about 400 pixels may be arranged horizontally in an area sensor used for a camera with a ⅔ inch optical system.

FIG. 1B shows the pixel arrangement disclosed in U.S. Pat. No. 4,336,556. When two vertically adjacent pixels A and B are paired, the respective pairs are arranged in a checkered pattern. Furthermore, vertical CCD registers (not shown) are formed in zigzag forms to extend between respective pairs of pixels. Note that the pixels A belong to field A while the pixels B belong to field B. Given a horizontal scanning line n, the intervals between the horizontally adjacent pixels are large. For this reason, the pixel signals corresponding to the immediately preceding scanning line (n−1) in the same field are delayed for one horizontal period (1H period) so as to compensate for the intervals between the horizontally adjacent pixels of the horizontal scanning line n. Degradation in horizontal resolution is thus prevented. The horizontal pixel pitch $P_{H2}$ in the pixel arrangement shown in FIG. 1B is smaller than the horizontal pixel pitch $P_{H1}$ in the pixel arrangement shown in FIG. 1A. This is because the horizontal pixel pitch is determined by a horizontal pitch between a predetermined pixel on a given scanning line and the corresponding pixel on the next scanning line. On the other hand, the vertical pixel pitch $P_{V2}$ in the pixel arrangement shown in FIG. 1B is the same as the vertical pixel pitch $P_{V1}$ in the pixel arrangement shown in FIG. 1A. However, since one scanning line is synthesized by the two adjacent horizontal scanning lines, the vertical resolution of the area sensor having the pixel arrangement shown in FIG. 1B is significantly lower than that of the area sensor having the pixel arrangement shown in FIG. 1A.

FIG. 1C shows another pixel arrangement disclosed in U.S. Pat. No. 4,336,556 also by the present applicant. Referring to FIG. 1C, the pixels A and B are arranged in a checkered pattern. Furthermore, vertical CCD registers (not shown) are also formed in a zigzag pattern so as to extend between each pair of adjacent pixels. Note also that the pixels A belong to field A and the pixels B belong to field B. Since the signals are read out from the zigzag pixel row by horizontal scanning, the horizontal scanning line also becomes zigzag in form. Therefore, the horizontal pixel pitch $P_{H3}$ in FIG. 1C is the same as the horizontal pixel pitch $P_{H2}$ in FIG. 1B and is smaller than the horizontal pixel pitch $P_{H1}$ in FIG. 1A. The vertical resolution of the area sensor shown in FIG. 1C is better than that of the area sensor shown in FIG. 1B. However, the vertical pixel pitch $P_{V3}$ in FIG. 1C is determined by the vertical dimension of the pixels and the vertical dimension of a transfer electrode (not shown) of the vertical CCD register. Thus, the vertical pixel pitch $P_{V3}$ is larger than the vertical pixel pitch $P_{V1}$ shown in FIG. 1A. In other words, the vertical resolution of the area sensor shown in FIG. 1C is lower than that of the area sensor shown in FIG. 1A.

SUMMARY OF THE INVENTION

It is an object of the present invention to provide a solid-state image pick-up device in which horizontal and vertical pixel packing densities are improved and vertical resolution is also improved.

According to an aspect of the present invention, there is provided a solid-state image pick-up device comprising: a first group of photosensitive pixels which are formed on a semiconductor substrate of one conductivity type and which are arranged in a first two-dimensional matrix form including columns; a second group of photosensitive pixels which are vertically offset from said first group of photo-sensitive pixels by a distance corresponding to about half a vertical pixel pitch and are arranged in a second two-dimensional matrix form including columns so as to form a checkered pattern together with said first group of photosensitive pixels; and a plurality of vertical registers, each of which extends along a respective column of the pixels and comprises charge coupled elements having means for simultaneously transferring charges from said first and second groups of photosensitive pixels to thereby form one field.

According to the present invention, since the horizontal pixel pitch is substantially determined by the horizontal dimension of the pixels, pixels may be packed at high density in the horizontal direction. Furthermore, vertical resolution is improved by reading out the signals by the interlace method.

BRIEF DESCRIPTION OF THE DRAWINGS

FIGS. 1A to 1C show various pixel arrangements of conventional CCD image pick-up devices;

DETAILED DESCRIPTION OF THE PREFERRED EMBODIMENTS

An area sensor according to an embodiment of the present invention will now be described with reference to the accompanying drawings. The basic principle of the present invention will first be described. Photosensitive pixels P of an area sensor of the present invention are arranged in a checkered pattern as in the solid-state image pick-up device shown in FIG. 1C. Vertical CCD registers (not shown) are arranged in a zigzag form along the pixel columns. Pixel signals are read out from the respective pixels by the pseudointerlace method. More specifically, in order to read out the field A, a horizontal scanning line is formed by the signals from pixels A which are arranged in a zigzag form as indicated by the solid line. To read out the field B, a horizontal scanning line is formed by the signals from pixels B which are similarly arranged in a zigzag form as indicated by the dotted line. Therefore, two horizontal scanning lines are formed within each vertical pixel pitch $P_{V4}$. Accordingly, the vertical resolution of the image pick-up device of the present invention is twice that of the image pick-up device shown in FIG. 1C. The area sensor of the present invention thus has an improved vertical resolution.

Figure 5A:
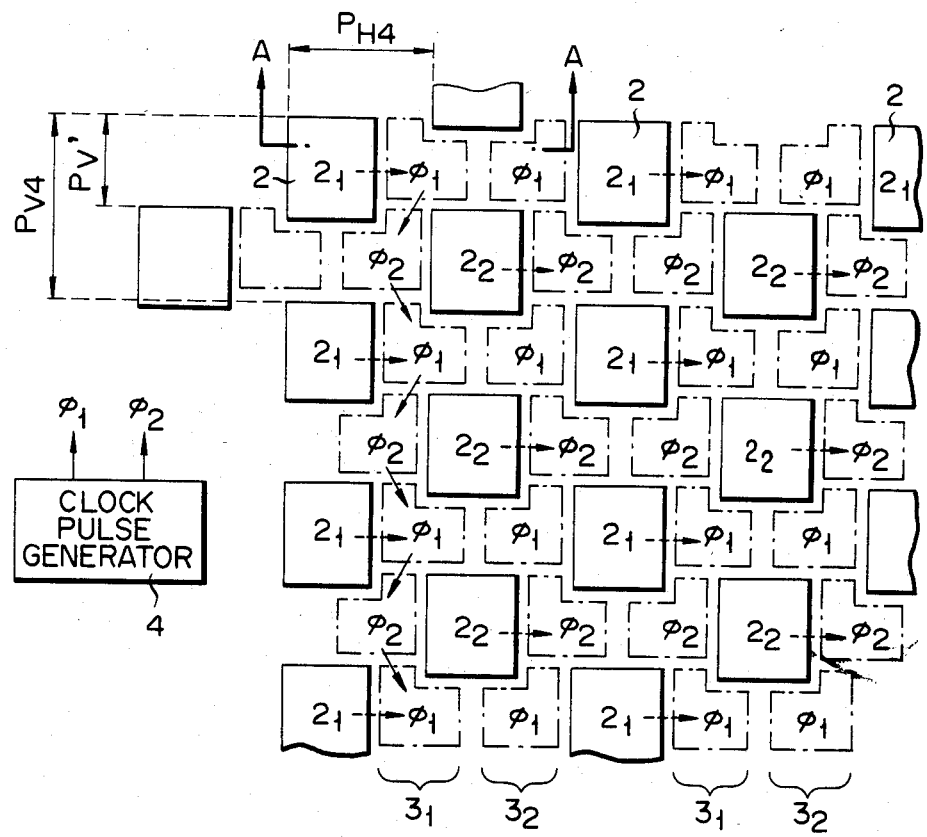
FIG. 5A is a schematic plan view of the image pick-up devices according to the embodiment of the present invention shown in FIG. 4.
Figure 5B:
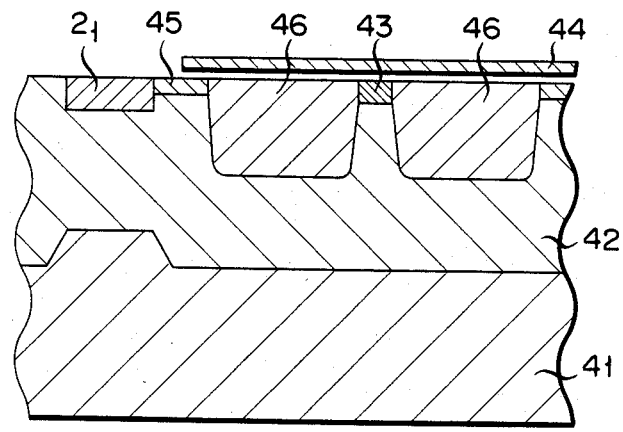
FIG. 5B is a sectional view of the image pick-up devices shown in FIG. 5A along the line A—A therein.
Figure 6:
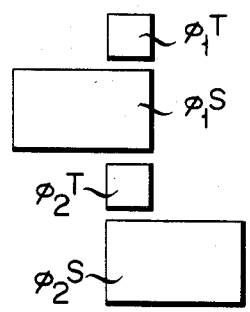
FIG. 6 is a schematic plan view showing the configuration of vertical CCD registers which are linear, unlike those of the solid-state image pick-up device shown in FIG. 5A.

The image pick-up device according to the present invention will be further described with reference to FIGS. 5A and 5B. FIG. 5A is a schematic plan view of the image pick-up device according to the embodiment of the present invention, and FIG. 5B is a sectional view of the image pick-up device shown in FIG. 5A along the line A—A therein. Referring to FIG. 5A, photosensitive pixels 2 are arranged in a checkered pattern on a semiconductor substrate of one conductivity type. Thus, a plurality of columns of pixels 2 are formed next to each other in the horizontal direction. The pixels of each column are designated by consecutive numbers in their ascending order of position in the figures. A first two-dimensional pixel matrix is formed by odd-numbered pixel columns, and a second two-dimensional pixel matrix is formed by even-numbered pixel columns, the even-numbered pixel columns being offset from the odd-numbered pixel columns by a distance corresponding to about half the vertical pixel pitch $P_{V4}$. Vertical CCD registers 3 ($3_1$, $3_2$) of 2-phase drive type are formed in a zigzag form along the respective pixel columns. Storing portions $\phi_1{}^S$ and $\phi_2{}^S$ of transfer electrodes $\phi_1$ and $\phi_2$ extend to the gaps between the vertically adjacent pixels of each pixel column, that is, extend in the gaps between the ends of the vertically adjacent pixels of each pixel column. As shown in FIG. 6, the transfer electrodes $\phi_1$ and $\phi_2$ consist of transfer portions $\phi_1{}^T$ and $\phi_2{}^T$ and storing portions $\phi_1{}^S$ and $\phi_2{}^S$. The transfer portions $\phi_1{}^T$ and $\phi_2{}^T$ are located in the gaps between the obliquely adjacent pixels between the corresponding adjacent pixel columns. The transfer portions $\phi_1{}^T$ and $\phi_2{}^T$ at the rightmost and leftmost pixel columns are located in the corresponding gaps.

Figure 7:
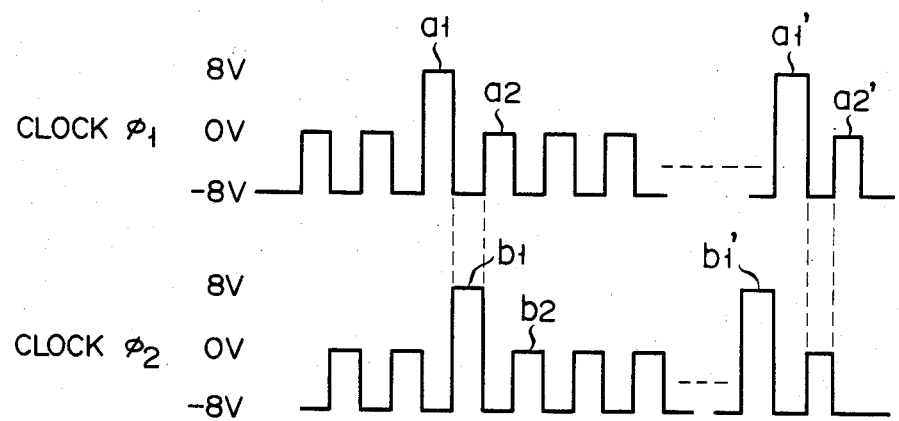
FIG. 7 shows transfer clock signals $\phi_1$ and $\phi_2$.

As a means for reading out the signals by the interlace method, a clock pulse generator 4 is used to supply transfer clocks $\phi_1$ and $\phi_2$ to the transfer electrodes $\phi_1$ and $\phi_2$, as shown in FIG. 7. The pixel signals transferred by the vertical CCD registers 3 ($3_1$, $3_2$) are transferred further by a horizontal CCD register (not shown) arranged below the pixels shown in FIG. 5A.

Referring to FIG. 5B, reference numeral 41 denotes an $n^-$-type semiconductor substrate; 42, a p-type layer; 43, a $p^+$-type channel stopper layer; 44, a transfer electrode; 45, a channel through which the signal charges from a photosensitive pixel 2 are transferred to the vertical register; and 46, an n-type layer. The vertical register is a buried channel CCD register. The p-type layer of the photosensitive pixel section 2 is narrower than that of the vertical CCD register section, so that the overflow charges from the photosensitive pixel are applied to the substrate 41. Such a vertical overflow drain is reported by Mr. Ishihara in pp. 168 and 169 of ISSCC (1982).

The readout operation by the interlace method of the area sensor shown in FIG. 5 will now be briefly described. In order to perform one horizontal scanning in the first field A, a signal of a vertically ith (i=1, 2, ..., n) pixel in an odd-numbered pixel $2_1$ column, and a signal of a vertically ith (i=1, 2, ..., n) pixel in the adjacent even-numbered pixel $2_2$ column are sequentially read out. In this manner, signals corresponding to n horizontal scanning lines are read out. Similarly, in order to perform one horizontal scanning in the second field B, a signal of a vertically (i-1)th (i=2, 3, ..., n) pixel in an odd-numbered pixel $2_1$ column, and a signal of a vertically ith (i=2, ..., n) pixel in the adjacent even-numbered pixel $2_2$ column are sequentially read out. In this manner, signals corresponding to (n-1) horizontal scanning lines are sequentially read out.

Figure 4:
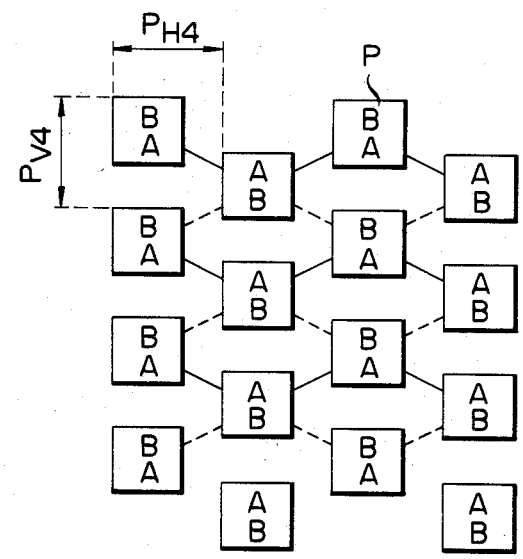
FIG. 4 shows a pixel arrangement of an image pick-up devices according to an embodiment of the present invention.

The readout operation will now be described in more detail. A case of one horizontal scanning of the first field A will be considered. First, a signal charge is transferred from the ith pixel of an odd-numbered pixel $2_1$ column to the storing portion $\phi_1{}^S$ of the transfer electrode $\phi_1$ of the horizontally adjacent vertical CCD register $3_1$, as indicated by the broken arrow. This operation will be called a field shift $\phi_1$. This field shift $\phi_1$ is performed in response to a pulse a1 of the clock $\phi_1$ shown in FIG. 7. Next, the signal charge is transferred from the ith pixel of an even-numbered pixel $2_2$ column to the storing portion $\phi_2{}^S$ of the transfer electrode $\phi_2$ of the horizontally adjacent vertical CCD register $3_2$, as indicated by the broken arrow. This operation will be called a field shift $\phi_2$ and is performed in response to a pulse b1 of the clock $\phi_2$ (FIG. 7). At the same time, i.e., in response to the pulse b1, the signal charge stored on the storing portion $\phi_1{}^S$ below the transfer electrode $\phi_1$ of the odd-numbered vertical CCD register $3_1$ is transferred to the storing portion $\phi_2{}^S$ through the transfer portion $\phi_2^T$ of the transfer electrode $\phi_2$ of the same vertical CCD register $3_1$. This operation is called a register transfer $\phi_2$. When the field shifts $\phi_1$ and $\phi_2$ and the register transfer $\phi_2$ as described above are completed, the signal charges on the pixels of one horizontal scanning line of the first field A indicated by the solid line in FIG. 4 are stored below the transfer electrodes $\phi_2$ arranged on the same horizontal scanning line. Subsequently, in response to a pulse a2 of the clock $\phi_1$ applied to the transfer electrode $\phi_1$ and a pulse b2 of the clock $\phi_2$ applied to the transfer electrode $\phi_2$, the signal charges are transferred in the vertical CCD registers $3_1$ and $3_2$ as indicated by the solid arrows in the figure. The signal charges corresponding to one horizontal scanning line are transferred to the horizontal CCD register all at once. The signal charges are then sequentially read out from the horizontal CCD register. The above-described readout operation from the horizontal CCD register for one horizontal scanning line is repeated for n horizontal scanning lines.

A case of one horizontal scanning of the second field B will now be described. The signal charge is transferred from the (i+1)th pixel in an even-numbered pixel $2_2$ column to the storing portion $\phi_2^S$ of the transfer electrode $\phi_2$ of the horizontally adjacent vertical CCD register $3_2$, as indicated by the broken arrow. This operation will be called a field shift $\phi_2$. This field shift $\phi_2$ is performed in response to a pulse b1' of the clock $\phi_2$ shown in FIG. 7. Subsequently, the signal charge is transferred from the ith (i=1, 2, . . . , n-1) pixel in an odd-numbered pixel $2_1$ column to the storing portion $\phi_1^S$ of the transfer electrode $\phi_1$ of the horizontally adjacent vertical CCD register $3_1$, as indicated by the solid arrow. This operation is called a field shift $\phi_1$ and is performed in response to a pulse a1' of the clock $\phi_1$ (FIG. 7). At the same time, i.e., in response to the pulse a1', the signal charge stored in the storing portion $\phi_2^S$ below the transfer electrode $\phi_2$ of an even-numbered vertical CCD register $3_2$ is transferred to the storing portion $\phi_1^S$ through the transfer portion $\phi_1^T$ of the transfer electrode $\phi_1$ of the same vertical CCD register $3_2$. This operation will be called a register transfer $\phi_1$. Accordingly, when the field shifts $\phi_2$ and $\phi_1$ and the register transfer $\phi_1$ are completed, the signal charges of one horizontal scanning line of the second field B indicated by the broken line in FIG. 4 are stored below the transfer electrodes $\phi_1$ arranged on the same horizontal scanning line. In response to a pulse b2' of the clock $\phi_2$ applied to the transfer electrode $\phi_2$ and a pulse a2' of the clock $\phi_1$ applied to the transfer electrode $\phi_1$, the signal charges are transferred within the vertical CCD registers $3_1$ and $3_2$, as indicated by the solid arrows. The signal charges of one horizontal scanning line are transferred to the horizontal CCD register all at once and are then read out from the horizontal CCD register. The readout operation from the horizontal CCD register of one horizontal scanning line is repeated for (n-1) horizontal scanning lines. Images of the first and second fields A and B are combined to provide an image of one frame.

Figure 2:
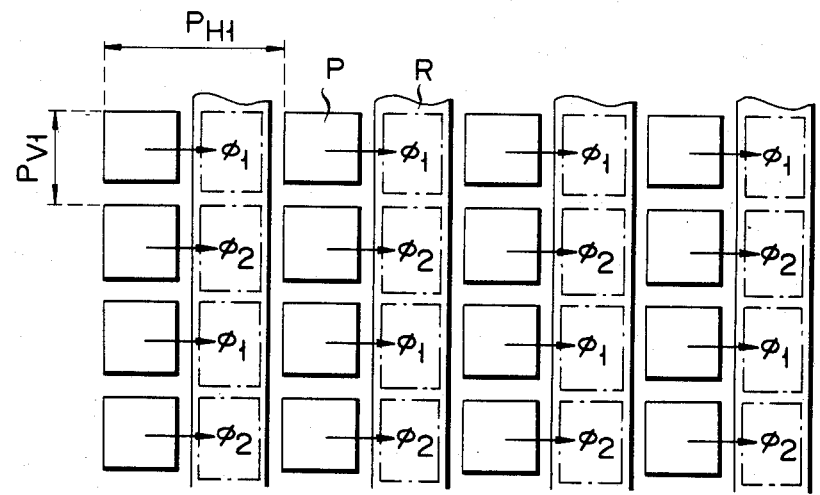
FIG. 2 is a schematic plan view of a conventional CCD image pick-up devices having the pixel arrangement shown in FIG. 1A.
Figure 3:
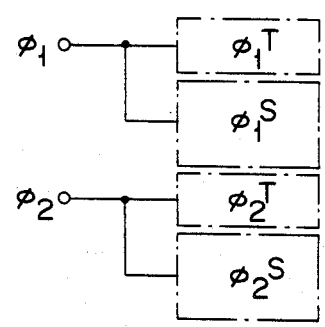
FIG. 3 is a representation showing a part of a vertical CCD shift register shown in FIG. 2.

According to the embodiment described above, the sizes of the transfer portions $\phi_1^T$ and $\phi_2^T$ of the transfer electrodes $\phi_1$ and $\phi_2$ relative to the storing portions $\phi_1^S$ and $\phi_2^S$ may be minimized. In other words, the transfer portions $\phi_1^T$ and $\phi_2^T$ may be regions which are wide enough to allow passage of charge but are narrow enough not to allow storage thereof. Therefore, although the areas of the storing portions $\phi_1^S$ and $\phi_2^S$ are limited by the maximum signal charge, the areas of the transfer portions $\phi_1^T$ and $\phi_2^T$ may be minimized within the range for allowing charge transfer. The storing portions $\phi_1^S$ and $\phi_2^S$ may have shapes such that parts thereof extend between the gaps between the vertically adjacent pixels of the pixel column. Therefore, the horizontal pixel pitch $P_{H4}$ of the area sensor is substantially determined by the horizontal dimension of the pixel and the widths of the transfer portions $\phi_1^T$ and $\phi_2^T$. The horizontal packing density of the area sensor of the present invention is thus improved over that of the area sensor shown in FIG. 2.

The pitch $P_v'$ of horizontal scanning lines in the vertical direction is determined by the vertical interval separating the adjacent pixels of two adjacent pixel columns. This interval may be made smaller than the vertical dimension of the pixels. In an area sensor used in a TV camera using a ⅔ inch optical system, the vertical pitch is generally 13 to 14 μm. However, since the pixel isolation regions and the transfer electrodes of the vertical CCD registers are inserted between the vertically adjacent pixels of the pixel columns, the vertical dimension of the pixels is actually limited to about 10 μm. In a color filter adhered on the area sensor for single-plate color camera, colors R, G and B are generally arranged in a mosaic manner. As a result the vertically adjacent colors are different from each other. In order not to allow color mixing between the vertically adjacent pixels, the size of the aperture of the conventional sensor becomes about 5 to 6 μm, taking into account the adhering precision (about 2 μm) of the color filter. When the aperture ratio is small, as in this case, the sensitivity of the sensor is significantly degraded. However, according to the embodiment of the present invention, the pitch $P_v'$ can be made smaller than the vertical dimension of the pixels. In other words, the vertical dimension of the pixels may be selected to be larger than that in the conventional area sensor. For example, the vertical dimension of the pixels may be selected to be 13 to 14 μm. Furthermore, since the intervals between any pair of adjacent pixels arranged in a checkered pattern can be made substantially equal in any direction, the adhering precision of the color filter may not affect the pixel size. Accordingly, the size of the aperture may be set to be about 10 μm. As a result, the aperture ratio becomes about twice that obtainable with a conventional image pick-up device and the sensitivity of the device is also doubled.

As described above, the widths of the transfer portions $\phi_1^T$ and $\phi_2^T$ of the transfer electrodes $\phi_1$ and $\phi_2$ can be minimized. In other words, the transfer portions $\phi_1^T$ and $\phi_2^T$ can be formed in the gaps between the obliquely adjacent pixels. In this case, if the widths of the transfer portions $\phi_1^T$ and $\phi_2^T$ are decreased, the potential well of the transfer portions $\phi_1^T$ and $\phi_2^T$ becomes shallower than that of the storing portions $\phi_1^S$ and $\phi_2^S$ due to the narrow channel effect. Thus, two regions having two different potential wells are formed below the transfer electrodes $\phi_1$ and $\phi_2$. For this reason, a general 2-phase drive may be achieved by using a single layer transfer electrode material (polysilicon of a first or second layer) for the transfer electrodes to which the same clock pulse is to be applied. Then, shortcircuiting between the transfer electrodes comprising a single layer is prevented, and the manufacturing yield of the image pick-up devices is improved.

It should be noted that an operation similar to that described above with reference to the above embodiment may be performed when the 4-phase drive type is adopted for the vertical CCD registers.

Figure 8:
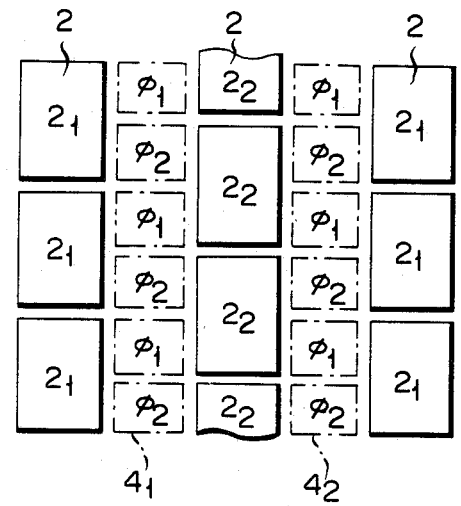
FIGS. 8, 9, 11, and 12 are plan views of solid-state image pick-up device according other embodiments of the present invention.

When linear vertical CCD registers $4_1$ and $4_2$ of the 2-phase drive type are arranged along each column of pixels 2 which are arranged in a checkered pattern, as shown in FIG. 8, a similar operation to that described above with reference to the above embodiment may be performed.

Figure 9:
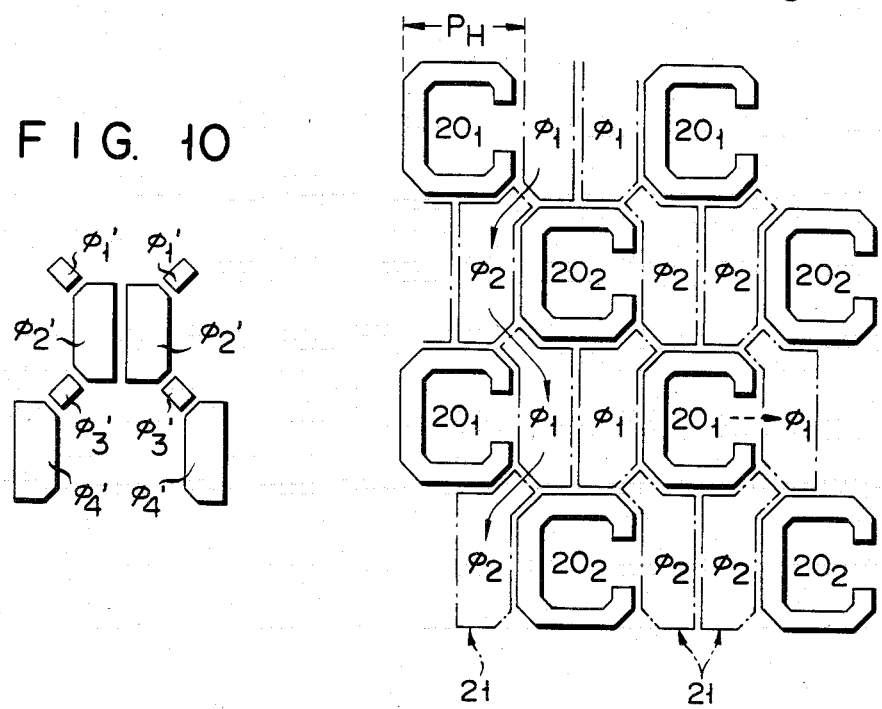

Another embodiment of the present invention will now be described with reference to FIG. 9. In an a solid-state image pick-up device as shown in FIG. 9, pixels 20 are arranged in a checkered pattern on a semiconductor substrate of one conductivity type. Of a plurality of pixel columns, pixels $20_1$ of odd-numbered pixel rows are arranged in a first two-dimensional matrix form, while pixels $20_2$ of even-numbered pixel rows are arranged to be offset vertically from the pixels $20_1$ by a distance corresponding to half the vertical pixel pitch and are arranged to be offset horizontally from the pixels $20_1$ by a distance corresponding to the horizontal pixel dimension and are arranged in a second two-dimensional matrix form. In this case, in a plane including the pixels 20, the shapes of the pixels 20 are so determined that gaps are formed between the obliquely adjacent pixels. Vertical transfer registers 21 of 2-phase drive type and comprising CCDs are formed in a zigzag form along the respective pixel columns. The transfer electrodes of the respective stages of the vertical transfer register 21 extend from the gap between the obliquely adjacent pixels to the gap between the vertically adjacent pixels. Reference symbol $\phi_1$ denotes a transfer electrode of a first phase while $\phi_2$ denotes a transfer electrode of a second phase. As for the transfer channels below the transfer electrodes $\phi_1$ and $\phi_2$, the transfer channel below the gap between the obliquely adjacent pixels is narrow while that below the gap between the vertically adjacent pixels is wide.

As a means for reading out the signal charges by the interlace method, a clock pulse generator (not shown) is included which supplies transfer clocks $\phi_1$ and $\phi_2$. The image signal transferred from the vertical transfer register 21 is transferred to horizontal CCD registers (not shown) formed below the pixels shown in FIG. 9.

The CCD image pick-up device as described above has a configuration similar to that shown in FIG. 5A except that the transfer direction of the narrow channel portion is oblique. Accordingly, the readout operation of this image pick-up device may be similar to that described with reference to the first embodiment of the present invention.

According to this embodiment, the horizontal pixel pitch $P_H$ is substantially determined by the horizontal dimension of the pixels independently of the width of the vertical CCD register 21. Accordingly, in a multipixel image pick-up device having 400 or 570 pixels in the horizontal direction, and having horizontal pixel pitch $P_H$ of 17 or 11.5 μm for a ½ inch optical system, the horizontal pixel pitch may be decreased by a distance corresponding to the width (2 to 3 μm) of the narrow channel portion. The advantages arising from such a reduction in the horizontal pixel pitch are tremendous. That is, the horizontal packing density is considerably improved, and thus, the resolution of the image pick-up device is improved.

Figure 10:
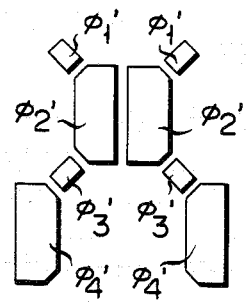
FIG. 10 is a plan view showing a modification of transfer electrodes of a vertical transfer register shown in FIG. 9.

An image pick-up device of 4-phase drive type may be obtained by dividing the transfer electrodes $\phi_1$ and $\phi_2$ into transfer electrodes $\phi_1'$ and $\phi_2'$ and transfer electrodes $\phi_3'$ and $\phi_4'$, as shown in FIG. 10.

Figure 11:
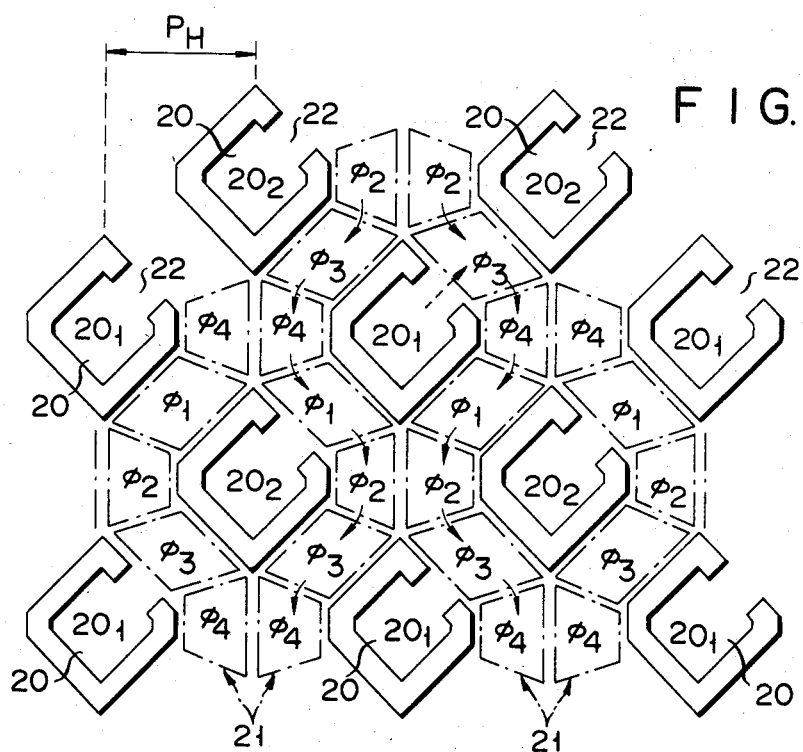

Still another embodiment of the present invention will now be described with reference to FIG. 11. An image pick-up device shown in FIG. 11 is different from that shown in FIG. 9 in that each pixel 20 in the former is turned about 45° from those shown in the latter and is formed in a rhombic shape. Thus, the signal charge transfer direction (field shift direction) from each pixel 20 to the vertical transfer register is oblique. The lengths and positions of transfer electrodes $\phi_1$ to $\phi_4$ of the first to fourth phases are determined so that vertical transfer registers 21 may be driven by the 4-phase drive method. The widths of the transfer electrode and of the transfer channels are kept substantially constant. In this image pick-up device, since field shift control regions 22 (regions between the pixels 20 and the vertical transfer registers 21) extend obliquely, their configuration does not affect the horizontal pixel pitch $P_H$.

The readout operation of the image pick-up device of this embodiment is different from that of the area sensor shown in FIG. 9 in that the vertical transfer registers 21 are driven by the 4-phase drive method. The remaining features of the readout operation of this embodiment remain the same as those of the image pick-up device shown in FIG. 9. The signal charges of one group of pixels are transferred to the positions below the transfer electrodes extending in the field shift direction. The signal charges below the transfer electrodes are shifted for two stages of transfer electrodes within the vertical transfer register. The signal charges of the other group of pixels are then similarly transferred to positions below the transfer electrodes extending in the field shift direction. Therefore, signal charges of one horizontal scanning line are obtained below a horizontal array of transfer electrodes. In this image pick-up device, the horizontal packing density may be improved as in the image pick-up device shown in FIG. 9. Furthermore, in this image pick-up device, the amount of signal charge which may be transferred by the 4-phase driven vertical transfer registers may be larger than that of the 2-phase driven vertical transfer registers. In the image pick-up device shown in FIG. 11, a similar effect may be obtained even if the lengths and positions of the transfer electrodes are changed for 3-phase drive.

Figure 12:
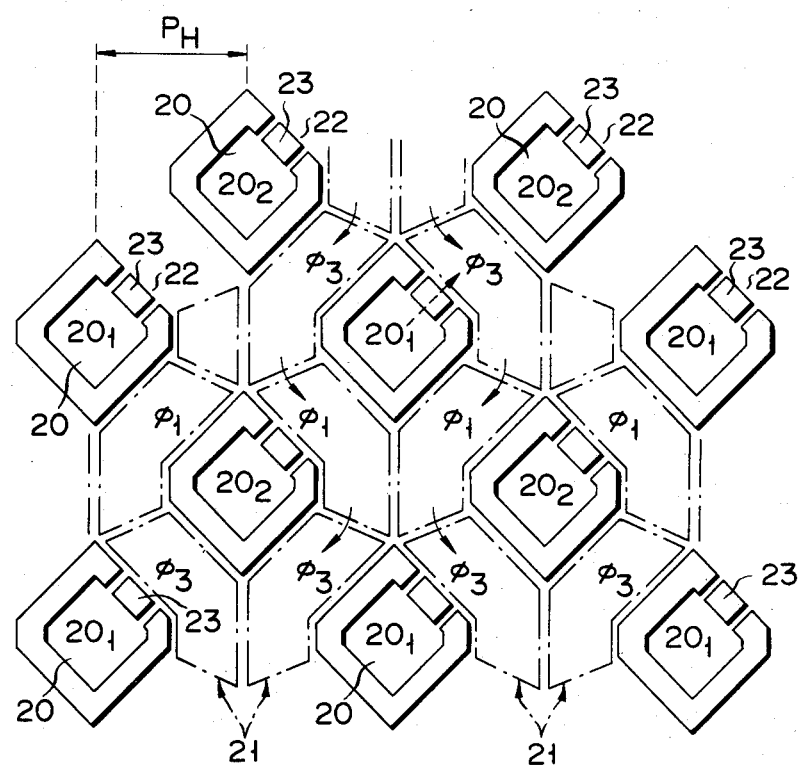

Still another embodiment of the present invention will now be described with reference to FIG. 12. In an image pick-up device shown in FIG. 12, for each pixel 20 as shown in the image pick-up device of FIG. 11, there is a MOS gate 23. The MOS gates 23 are addressed by an address circuit in correspondence with the scanning pixel order so as to sequentially read out the pixel signals. Hence, the vertical CCD register need not transfer the signal charges from all pixels. Therefore, it needs fewer charge transfer electrodes than otherwise. The pixels can be arranged more densely, thus enhancing the sensitivity of the image pick-up device.

What is claimed is:
1. A solid-state image pick-up device comprising:
   a first group of photosensitive pixels which are formed on a semiconductor substrate of one conductivity type and which are arranged in a first two-dimensional matrix form including columns;
   a second group of photosensitive pixels which are vertically offset from said first group of photosensitive pixels by a distance corresponding to about half a vertical pixel pitch and are arranged in a second two-dimensional matrix form including columns so as to form a checkered pattern together with said first group of photosensitive pixels;

a plurality of vertical registers, each of which extends along a respective column of said pixels and comprises charge coupled elements having means for simultaneously transferring charges from said first and second groups of photosensitive pixels;

said charge transferring means comprising a plurality of charge transfer portions, each of which is arranged in a horizontal gap between obliquely adjacent ones of said pixels;

said vertical registers further having a plurality of charge storing portions, each of which is arranged in vertical alignment with a respective one of said charge transfer portions, extends to a gap between vertically adjacent ones of said pixels in each of said columns, and has a channel width wider than a channel width of said charge transfer portions; and interlace reading means for sequentially reading out, in each horizontal scanning during readout of a first field, a signal from a vertically ith (i=1, 2, ...) one of said pixels in each of said columns of said first group of photosensitive pixels and a signal from a vertically ith (i=1, 2, ...) one of said pixels in each of said columns of said second group of photosensitive pixels in an order of i, and for sequentially reading out, in each horizontal scanning in readout of a second field, a signal from the (i-1)th (i=2, 3, ...) one of said pixels in each of said columns of said first group of photosensitive pixels and a signal from an ith (i=2, 3, ...) one of said pixels in each of said columns of said second group of photosensitive pixels in the order of i.

2. A solid-state image pick-up device according to claim 1, wherein said vertical registers are of a 2-phase drive type having first and second transfer electrodes, respectively, comprising said charge transfer portions and charge storing portions, respectively.

3. A solid-state image pick-up device according to claim 1, wherein said interlace reading means comprising:

means for, during the readout of the first field, transferring the signal charges from said pixels in each of said columns of said first group of photosensitive pixels to said storing portions of horizontally adjacent ones of said first transfer electrodes, transferring the signal charges below said adjacent ones of said first transfer electrodes to said second transfer electrodes within the same ones of said vertical registers, and for transferring the signal charges from said pixels in each of said columns of said second group of photosensitive pixels to said storing portions of horizontally adjacent ones of said second transfer electrodes, thereby obtaining charge signals of one horizontal scanning line below an array of said second transfer electrodes; and means for, during the readout of the second field, transferring the signal charges from said pixels in each of said columns of said second group of photosensitive pixels to said storing portions of corresponding ones of said second transfer electrode, transferring the signal charges below said corresponding ones of said second transfer electrodes to said first transfer electrodes within the same ones of said vertical registers, and for transferring the signal charges from said pixels in each of said columns of said first group of photosensitive pixels to said storing portions of corresponding ones of said first transfer electrodes, thereby obtaining the charge signals of one horizontal scanning line below an array of said first transfer electrodes.

* * * * *

UNITED STATES PATENT AND TRADEMARK OFFICE
CERTIFICATE OF CORRECTION

PATENT NO. : 4,602,289

DATED : July 22, 1986

INVENTOR(S) : Hirokazu Sekine

It is certified that error appears in the above—identified patent and that said Letters Patent is hereby corrected as shown below:

Please change the city address of the assignee to read --Kawasaki--.

Signed and Sealed this

Sixth Day of January, 1987

*Attest:*

DONALD J. QUIGG

*Attesting Officer*     *Commissioner of Patents and Trademarks*